(12) United States Patent
Park et al.

(10) Patent No.: US 7,592,625 B2
(45) Date of Patent: Sep. 22, 2009

(54) SEMICONDUCTOR TRANSISTOR WITH MULTI-LEVEL TRANSISTOR STRUCTURE AND METHOD OF FABRICATING THE SAME

(75) Inventors: Han-Byung Park, Seongnam-si (KR); Hoon Lim, Seoul (KR); Soon-Moon Jung, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 39 days.

(21) Appl. No.: 11/502,397

(22) Filed: Aug. 11, 2006

(65) Prior Publication Data

US 2007/0047371 A1  Mar. 1, 2007

(30) Foreign Application Priority Data

Aug. 12, 2005  (KR) .................. 10-2005-0074220

(51) Int. Cl.
*H01L 31/112* (2006.01)
(52) U.S. Cl. .............................. 257/67; 257/903
(58) Field of Classification Search ............ 257/67, 257/903, E27.026, E27.098, E27.111
See application file for complete search history.

(56) References Cited

U.S. PATENT DOCUMENTS

| 6,287,913 | B1 | 9/2001 | Agnello et al. |
| 6,569,729 | B1 | 5/2003 | Wu et al. |
| 7,315,466 | B2 * | 1/2008 | Han et al. ............ 365/154 |

FOREIGN PATENT DOCUMENTS

| JP | 2005-136436 | 5/2005 |
| KR | 100252864 B1 | 1/2000 |
| KR | 10-1999-0035652 | 9/2000 |
| KR | 100295039 B1 | 4/2001 |
| KR | 10-2003-0070968 | 9/2003 |

* cited by examiner

*Primary Examiner*—Zandra Smith
*Assistant Examiner*—Paul E Patton
(74) *Attorney, Agent, or Firm*—Harness, Dickey & Pierce, P.L.C.

(57) ABSTRACT

Example embodiments relate to a semiconductor device and a method of fabricating the same. The device may include a semiconductor substrate including a peripheral region and a cell array region, wherein the substrate in the cell array region may be recessed lower than the peripheral region, a plurality of cell transistor layers stacked in the cell array region, and a plurality of peripheral circuit transistors formed in the peripheral region. The cell transistor layers may be formed in the cell array region at a lower level than the peripheral region.

13 Claims, 8 Drawing Sheets

SEMICONDUCTOR TRANSISTOR WITH MULTI-LEVEL TRANSISTOR STRUCTURE AND METHOD OF FABRICATING THE SAME

PRIORITY STATEMENT

This U.S. non-provisional patent application claims priority under 35 U.S.C. § 119 to Korean Patent Application 2005-74220, filed on Aug. 12, 2005, in the Korean Intellectual Property Office (KIPO), the entire contents of which are incorporated herein by reference.

BACKGROUND

1. Field

Example embodiments relate to a semiconductor device and a method of fabricating the same. Other example embodiments relate to a semiconductor device with a multi-level transistor structure and a method of fabricating the same.

2. Description of the Related Art

Usually in the field of semiconductor technology, semiconductor devices with multi-level transistor structures are studied in order to advance integration degrees of memory cells in a unit area. A semiconductor device with a multi-level transistor structure may be relatively tall, because multiple levels of insulation layers are stacked on a semiconductor substrate. Transistors may be formed in active region patterns on the multi-level insulation layers, which raises the integration density of transistors in a unit area.

Such a multi-level transistor structure is needed for semiconductor memory devices that require higher integration density. For instance, multi-level transistors are more suitable for cell array regions of flash memory devices or static RAMs, which include a single transistor or plural transistors in a unit cell, rather than dynamic RAMs employing a higher-level capacitor structure.

Figure 1:
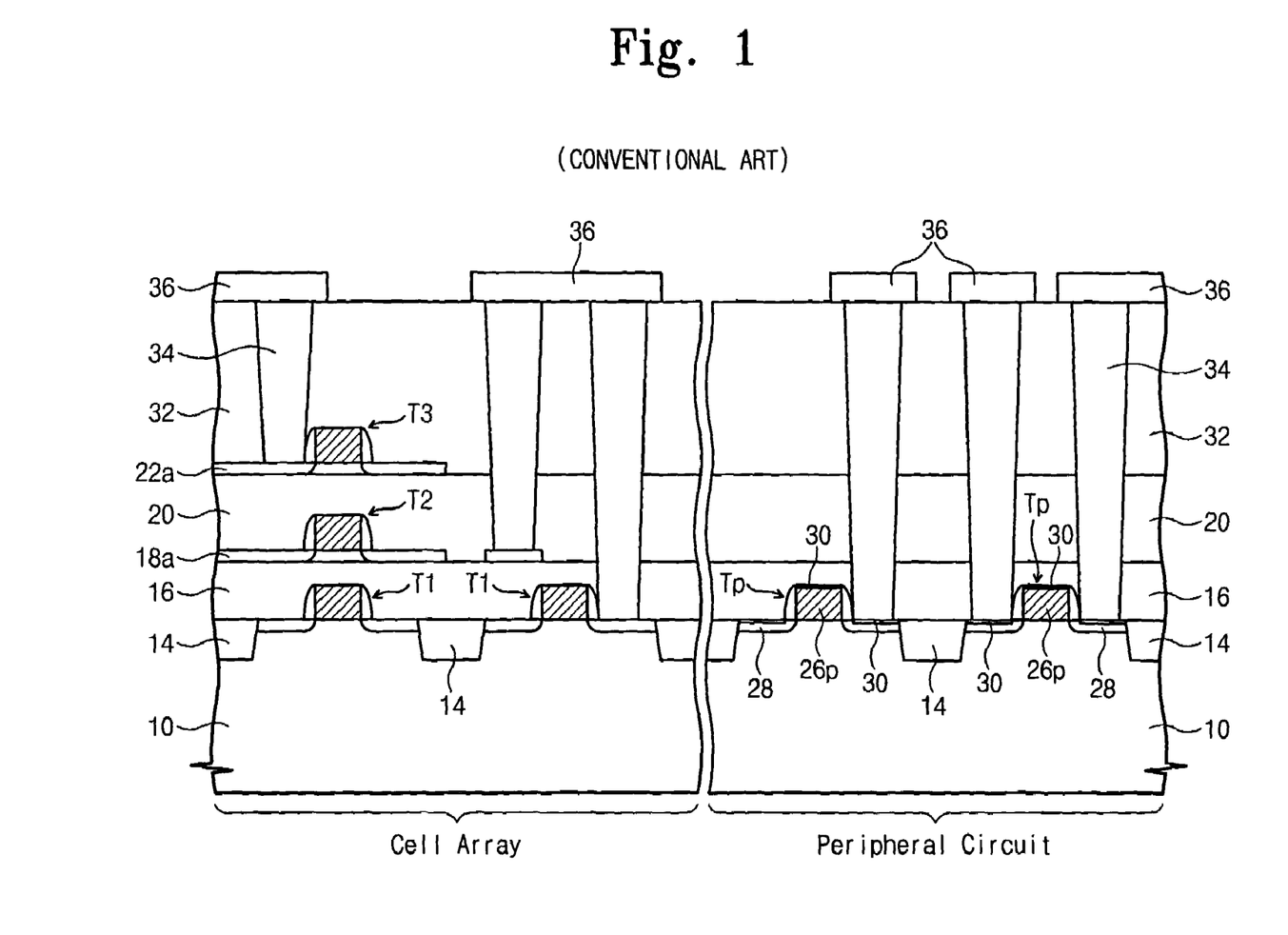
FIG. 1 is a diagram illustrating a conventional semiconductor device.

FIG. 1 is a diagram illustrating a conventional static RAM with a multi-level transistor structure. Referring to FIG. 1, the semiconductor memory device (e.g., a static RAM) may be configured to include a cell array region where memory cells are arranged, and a peripheral region where peripheral circuits are disposed. The cell array region may be required to have a higher integration degree for larger memory capacity, while the peripheral region needs to have higher performance peripheral circuits for improving operational performance of the semiconductor memory device.

As illustrated in FIG. 1, in the conventional static SRAM, the cell array region may be formed with multi-level transistor layers while the peripheral region may be formed with single-level transistors Tp on a substrate 10. The peripheral transistors Tp may be formed in active regions that are defined by field isolation films 14. Cell transistors T1, located at the bottom of the multi-level transistor layers, may be formed in the active regions defined by the field isolation films 14, similar to the peripheral transistors Tp. Cell transistors T2 and T3, located on upper layers over the cell transistor T1, may each be formed on semiconductor active patterns 18a and 22a and interposed among interlevel insulation films 16, 20, and 32. The transistors T1, T2, T3, and Tp may be connected to contact patterns 34 and interconnection layers 36 by circuit design As illustrated in FIG. 1, the higher integration of the cell array region may be accomplished by adopting the multi-level transistor structure thereto. The transistors Tp may be formed in a structure of self-aligned silicidation for higher performance operation of the peripheral circuit. The silicidation structure may be constructed with self-aligned salicide layers (hereinafter, referred to as 'salicide layers') formed on source/drain regions and gate electrodes in the transistors. The silicidation structure may reduce sheet resistance of the source/drain regions and may provide a faster driving speed by forming ohmic layers among the source/drain regions, gate electrodes, and contact patterns.

As in the static RAM, the peripheral circuit transistors Tp may be formed at the same level with the lowest cell transistors T1. The peripheral circuit transistors may deteriorate while forming the multi-level cell transistors T2 and T3. For example, pollution due to diffusion of metal that forms the salicide layers 30 may deteriorate the peripheral circuit transistors Tp. The lowest cell transistors T1 may also increase resistance by silicide agglomeration. Accordingly, it may be more difficult to fabricate a higher-frequency and higher-performance semiconductor device because the peripheral circuits are degraded in operational performance.

SUMMARY

Example embodiments are directed to a semiconductor device with a multi-level transistor structure and capable of forming a peripheral circuit with improved performance and a method of fabricating the same.

Example embodiments of the semiconductor device may include a semiconductor substrate, including a peripheral region and a cell array region, wherein the semiconductor substrate in the cell array region is recessed lower than the peripheral region, a plurality of cell transistor layers stacked in the cell array region and a plurality of peripheral circuit transistors formed on the semiconductor substrate in the peripheral region.

In example embodiments, the plurality of peripheral circuit transistors may be formed at a same level as the uppermost of the cell transistor layers. In other example embodiments, the plurality of peripheral circuit transistors may be formed at a different level than an uppermost one of the plurality of cell transistor layers. A global interlevel insulation film may cover the plurality of peripheral circuit transistors and the uppermost of the plurality of cell transistor layers. The plurality of peripheral circuit transistors may be constructed in silicidation. In example embodiments, source/drain regions of the plurality of peripheral circuit transistor layers may include salicide layers. A salicide layer may also be formed on source/drain regions of the plurality of peripheral circuit transistors. In other example embodiments, source/drain regions of a cell transistor layer, under the uppermost cell transistor layer, may be completed without salicide layers. Source/drain regions of the uppermost of the plurality of cell transistor layers may also include salicide layers. The lowest one of the plurality of cell transistor layers may be formed on the substrate of the cell array region.

The multi-level transistor layers may be isolated from each other by local interlevel insulation films. In the device, the multi-level local interlevel insulation films may be formed in the cell array region. Semiconductor active patterns may be formed on each of the local interlevel insulation films. The plurality of cell transistor layers may be formed on the semiconductor active patterns over the lowest of the plurality of cell transistor layers. The plurality of peripheral circuit transistors may be formed in the peripheral region. The plurality of cell transistor layers, formed over the lowest of the plurality of cell transistor layers, may be formed of transistors with full depletion channels.

Example embodiments provide a method of fabricating a semiconductor device which may include removing a semiconductor substrate of a cell array region to form a recessed cell array region lower than the peripheral region, forming a plurality of cell transistor layers on the semiconductor substrate of the cell array region and forming a plurality of peripheral circuit transistors on the semiconductor substrate in the peripheral region while forming the uppermost of the plurality of cell transistor layers. A semiconductor substrate may be removed by etching.

The method may further comprise alternately stacking a local interlevel insulation film and a semiconductor active pattern in the cell array region and forming cell transistor layers on each of the semiconductor active patterns to complete a plurality of cell transistor layers. In example embodiments, the plurality of peripheral circuit transistors may be formed at a same level as an uppermost one of the plurality of cell transistor layers. In other example embodiments, the plurality of peripheral circuit transistors may be formed at a different level than an uppermost one of the plurality of cell transistor layers.

In example embodiments, forming the cell transistor layer on the local interlevel insulation film may include forming the local interlevel insulation film in the cell array region, forming a semiconductor layer on the local interlevel insulation film; patterning the semiconductor layer to form a plurality of the semiconductor active patterns and forming the plurality of cell transistor layers on the semiconductor active patterns. This may be repeated to form a plurality of the semiconductor layers in the cell array region.

The uppermost cell transistor layer may be formed at the same time as the peripheral circuit transistor. A semiconductor layer may be formed on the local interlevel insulation film in the cell array region. The process may be carried out by patterning the semiconductor layer and the semiconductor substrate in the peripheral region to define the uppermost semiconductor active pattern in the cell array region and active regions in the peripheral region and forming the plurality of cell transistor layers and the plurality of peripheral circuit transistors on the uppermost semiconductor active pattern and the peripheral active regions, respectively.

The semiconductor substrate of the peripheral active regions may be selectively patterned to form peripheral circuit trenches. The uppermost semiconductor layer and the local interlevel insulation film may be partially patterned in sequence to form cell trenches. As the local interlevel insulation film has etching selectivity to the semiconductor substrate, the cell trenches may be shallower than the peripheral circuit trenches. The cell and peripheral circuit trenches may be filled with an insulation film, forming field isolation films.

The plurality of cell transistor layers and the plurality of peripheral circuit transistors may be formed by forming gate insulation films on the uppermost semiconductor active pattern and the peripheral active regions. Gate electrodes may be formed on gate insulation films. Impurities may be implanted into the semiconductor active patterns and the peripheral active regions at both sides of the gate electrodes to form source/drain regions. Salicide layers may be formed on source/drain regions and gate electrodes of the uppermost cell transistor and the peripheral circuit transistors. Spacer insulation films may be formed on sidewalls of the gate electrodes exposing peripheral active regions beside the spacer insulation films and the upper portion of the gate electrodes. Salicide layers may be formed on the semiconductor active patterns.

BRIEF DESCRIPTION OF THE DRAWINGS

Example embodiments will be more clearly understood from the following detailed description taken in conjunction with the accompanying drawings. FIGS. 1-8 represent non-limiting, example embodiments as described herein.

DETAILED DESCRIPTION OF EXAMPLE EMBODIMENTS

Example embodiments will be described below in more detail with reference to the accompanying drawings. The example embodiments may be embodied in different forms and should not be construed as limited to the embodiments set forth herein. These example embodiments are provided so that this disclosure will be thorough and complete, and will fully convey the scope of the example embodiments to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to a semiconductor device and a method of fabricating the same. Example embodiments relate to a semiconductor device with a multi-level transistor structure and a method of fabricating the same.

Figure 2:
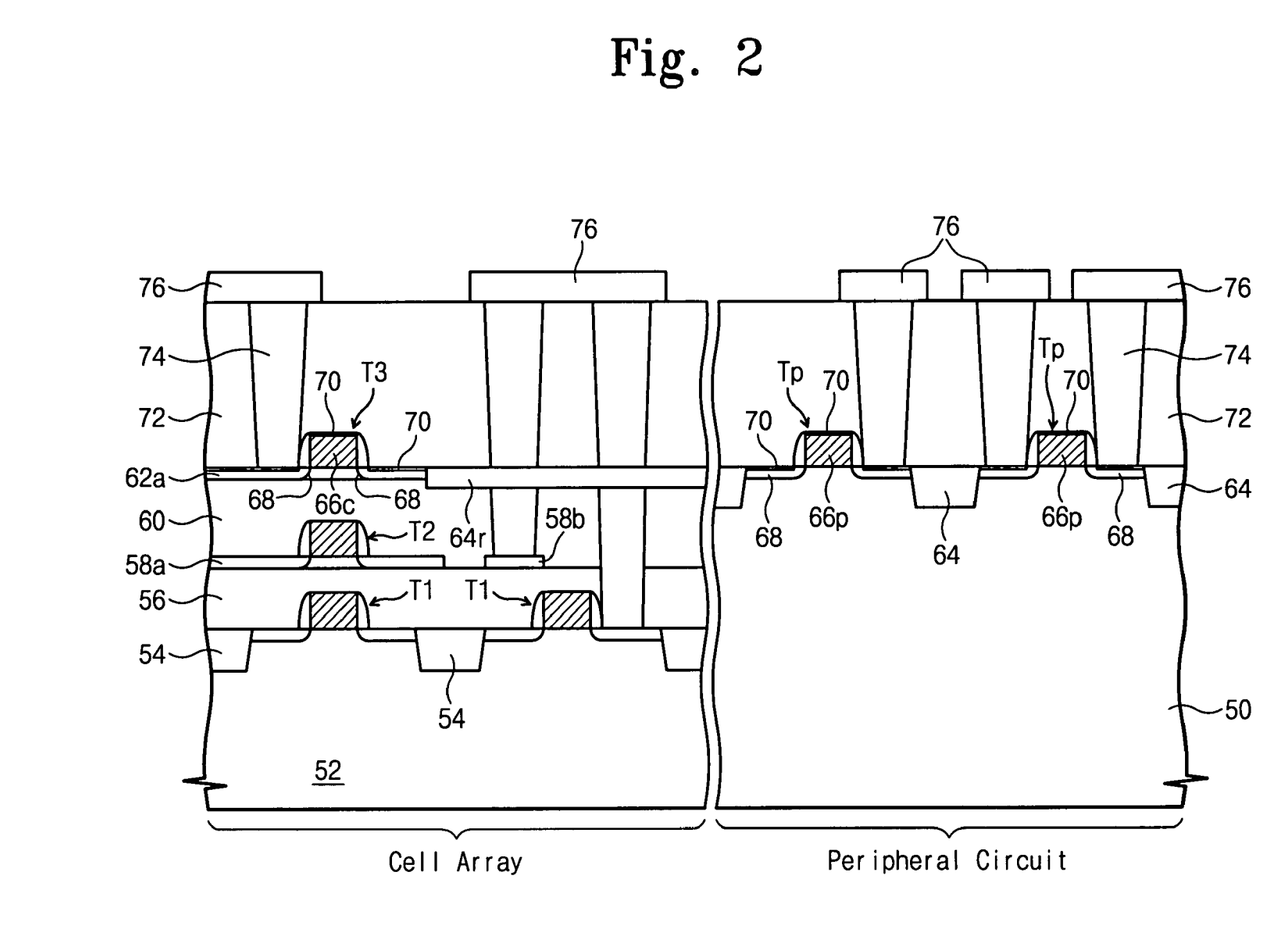
FIG. 2 is a diagram illustrating a semiconductor device in accordance with example embodiments.

FIG. 2 is a diagram illustrating a semiconductor device in accordance with example embodiments. Referring to FIG. 2, cell array and peripheral circuit regions may be defined in the semiconductor substrate 50. A cell array substrate 52 may be recessed lower than the peripheral region. Multiple layers of cell transistors may be formed in the recessed cell array region. The lowest cell transistor layer may be formed in the recessed cell array substrate 52. Field isolation films 54 may be formed to active regions in the recessed substrate 52. Cell transistors T1 may be formed on the lowest cell transistor layer in the active region. Local interlevel insulation films 56 and 60 may be stacked on the lowest cell transistor layer. The local interlevel insulation films 56 and 60 may be confined to the cell array region. The cell transistor layers may be arranged on each of the local interlevel insulation films 56 and 60. A first semiconductor active pattern 58a may be formed on the first local interlevel insulation film 56, while a second semiconductor active pattern 62a may be formed on the second local interlevel insulation film 60. Cell transistors T2 and T3 may be fabricated in the first and second semiconductor active patterns 58a and 62a, forming the cell transistor layers, respectively. There may be more than two cell transistor layers formed.

Peripheral circuit transistors Tp may be arranged on the substrate of the peripheral region. The peripheral circuit transistors Tp may be in the active regions defined by field isolation films 64. The cell transistor layers may be isolated from each other through the local interlevel insulation films and the peripheral circuit transistors Tp may be at the same level as the uppermost cell transistor T3. However, the uppermost cell transistor T3 may be at a different level than the peripheral circuit transistor Tp.

On the source/drain regions 68 of the peripheral circuit transistors Tp, salicide layers 70 may reduce resistance thereof and may form ohmic layers at junction areas between contact patterns 72 and the source/drain regions 68. The salicide layers 70 may also be formed on gate electrodes 66p. The salicide layers 70 may be formed on the source/drain regions 68 and the gate electrodes 66p may be aligned to spacer patterns formed on sidewalls of the gate electrodes 66p in the peripheral circuit transistors Tp. Similar to the peripheral circuit transistors Tp, the salicide layers 70 may also be disposed on the source/drain regions 68 and gate electrodes 66c in the uppermost cell transistor T3.

On the substrate with the cell array and peripheral regions, a global interlevel insulation film 72 may be formed to cover the uppermost cell transistor T3 and the peripheral circuit transistors Tp. Interconnection layers 76 may be arranged on the global interlevel insulation film 72. The interconnection layers 76 may be connected with the cell transistors and the peripheral circuit transistors by vias 74.

Figure 3:
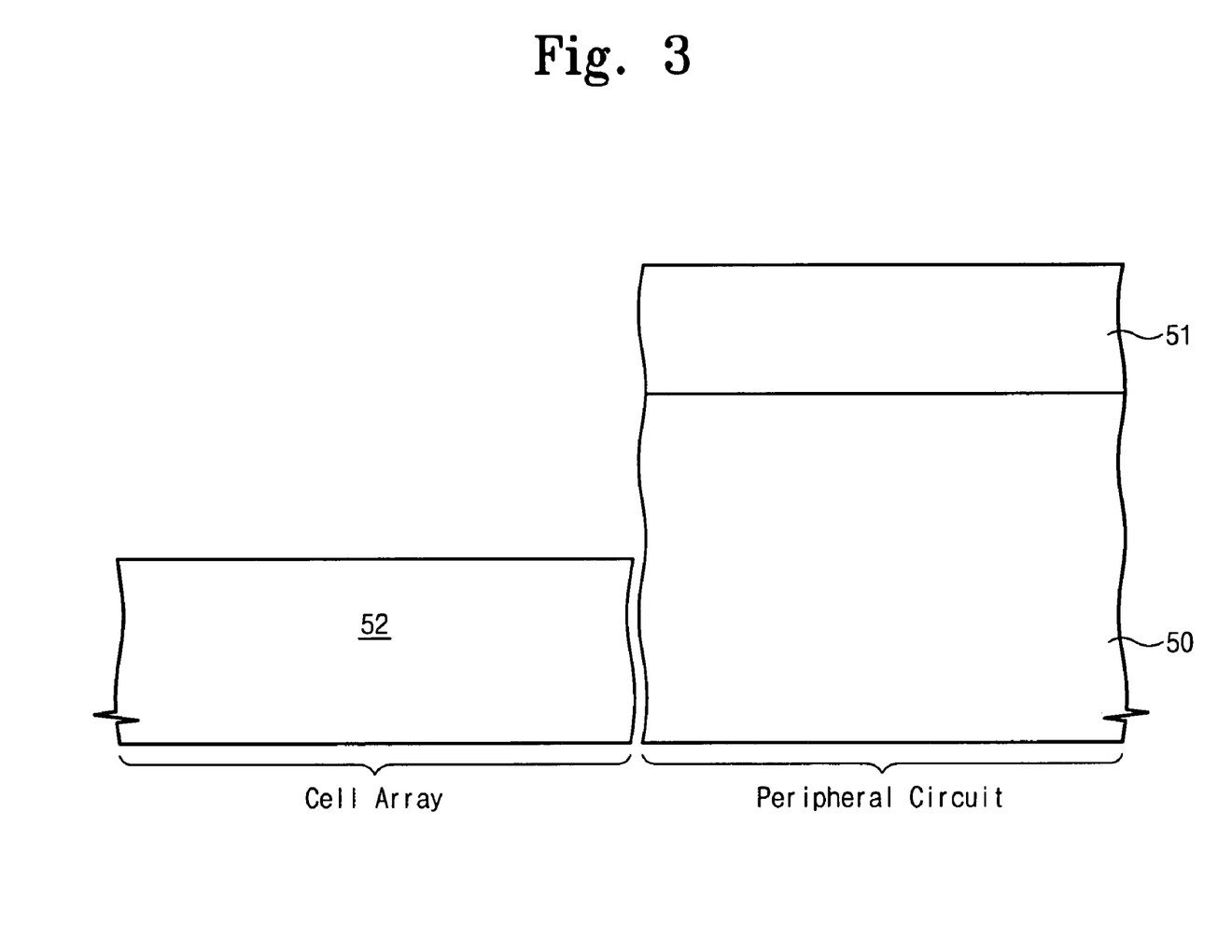
FIGS. 3-8 are diagrams illustrating the procedure of fabricating the semiconductor device in accordance with example embodiments.

FIGS. 3-8 are diagrams illustrating the procedure of fabricating the semiconductor device in accordance with example embodiments. Referring to FIG. 3, the cell array and peripheral regions may be defined in the semiconductor substrate 50. The cell array region may be selectively etched using a mask layer 51, which covers the peripheral region. The cell array substrate 52 may be recessed lower than the peripheral region. The recessing depth of the cell array region may be established in consideration of the number of cell transistors to be stacked thereon.

Figure 4:
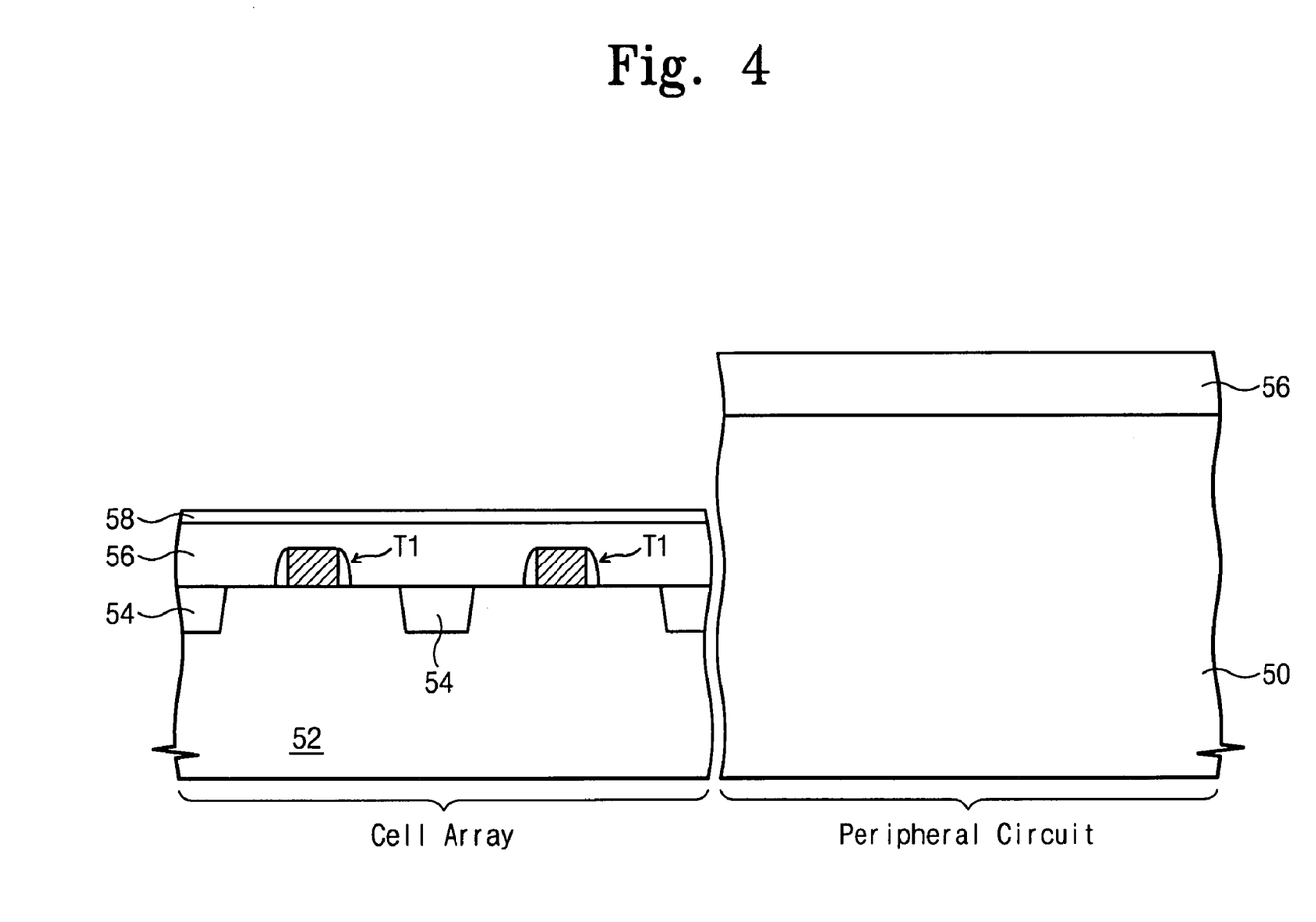

Referring to FIG. 4, after removing the mask layer 51, the field isolation films 54 may be formed to define the active regions in the cell array substrate 52. The cell transistors T1 may be formed to complete the lowest cell transistor layer in the active regions. The cell transistors T1 may be PMOS and/or NMOS transistors. The local interlevel insulation film 56 may be formed in the cell array region where the cell transistors T1 are disposed. The local interlevel insulation film 56 may also be formed in the peripheral region, covering the entire substrate. The semiconductor layer 58 may be formed on the local interlevel insulation film 56 in the cell array region. The semiconductor layer 56 may be an amorphous layer formed by a chemical vapor deposition process and/or an epitaxial layer.

Figure 5:
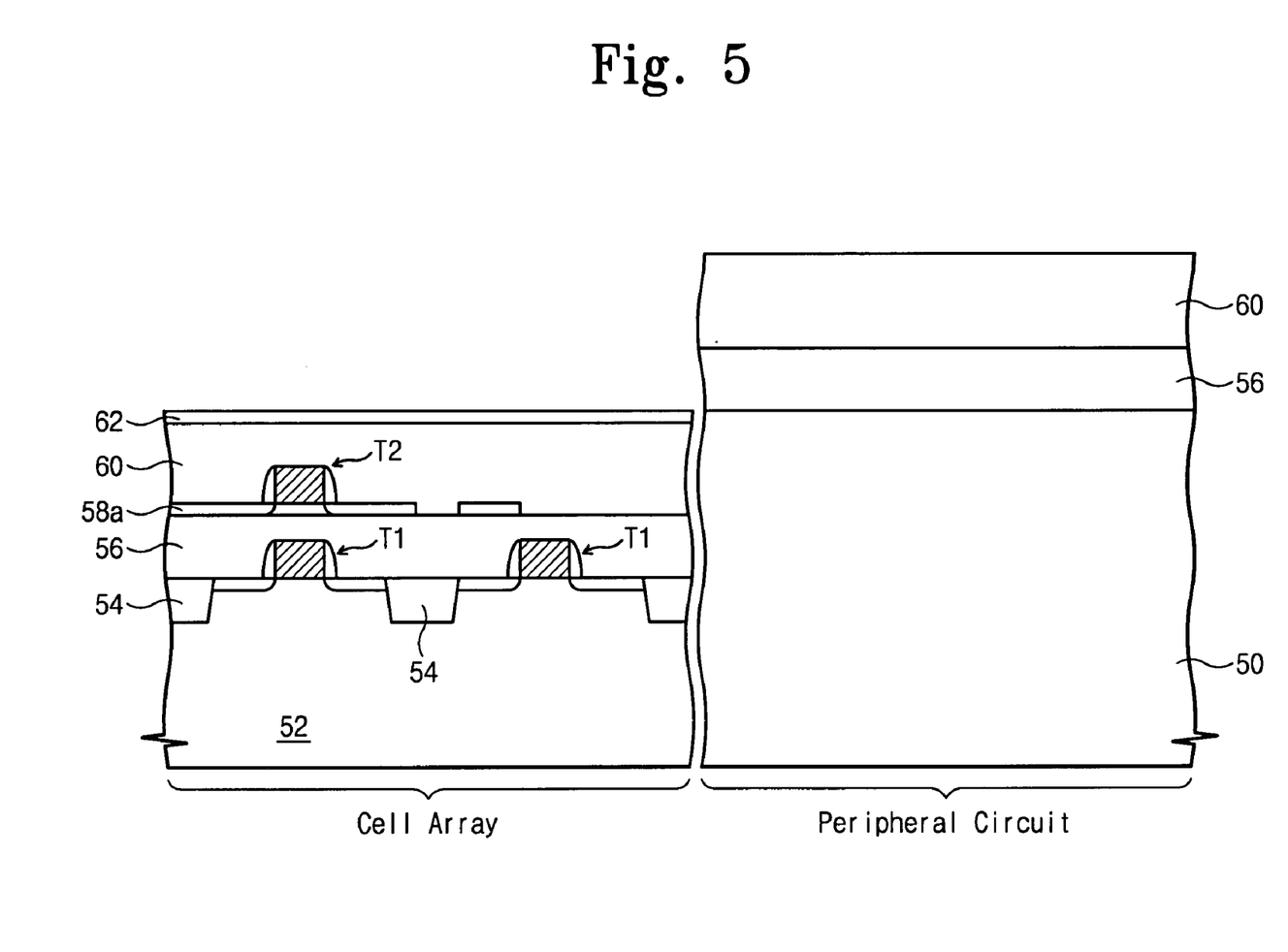

Referring to FIG. 5, the semiconductor layer 58 may be patterned to form the semiconductor active pattern 58a. The cell transistor T2 may be formed on the semiconductor active pattern 58a. After depositing a local interlevel insulation film on the cell array region, a cell transistor layer (not shown) may be further formed on the local interlevel insulation film. The local insulation film and the cell transistor layer may be repeatedly formed in order to create a plurality of cell transistors. After forming one or more cell transistors, the local interlevel insulation film 60 may be deposited uppermost in the cell array region. The uppermost semiconductor layer 62 may be formed on the local interlevel insulation film 60.

Figure 6:
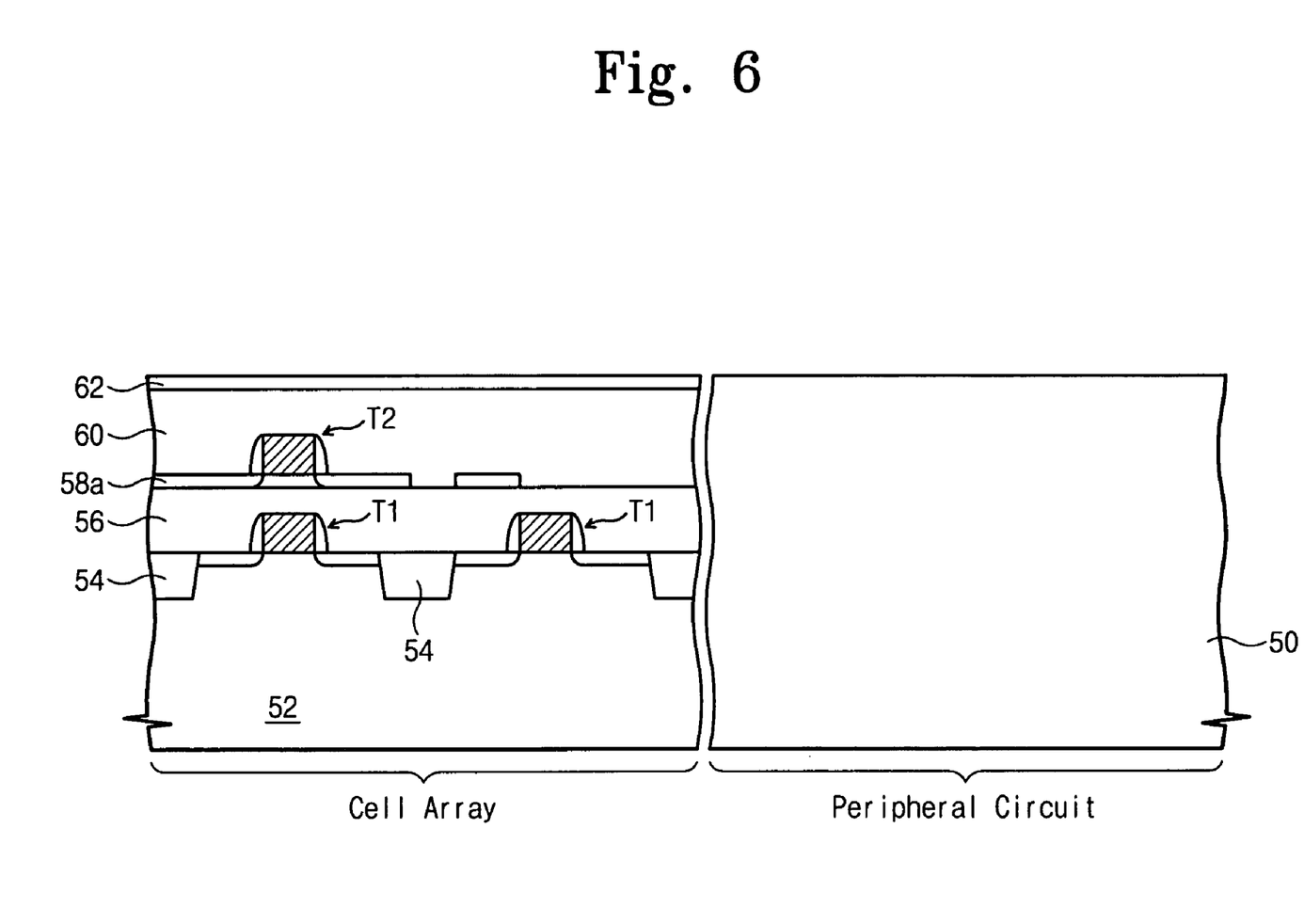

While forming the plurality of cell transistor layers, the insulation films 56 and 60 may also be stacked in the peripheral region. Referring to FIG. 6, the insulation films 56 and 60 may be removed from the peripheral region.

Figure 7:
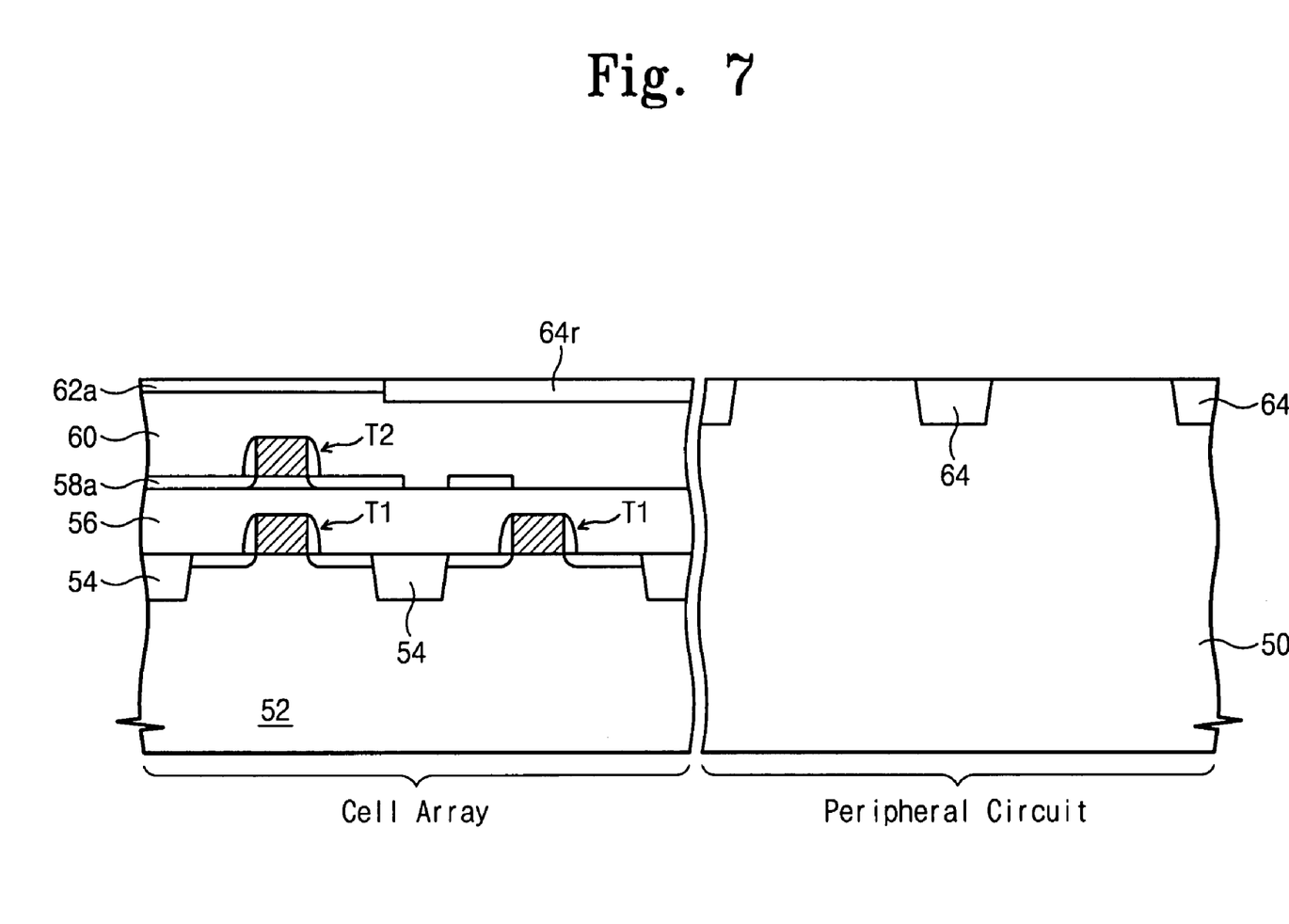

Referring to FIG. 7, the uppermost semiconductor layer 62 of the cell array region and the substrate in the peripheral region may be patterned to form cell trenches and peripheral circuit trenches. The cell and peripheral circuit trenches may be filled with an insulation film, forming the cell field isolation film 64r and the peripheral-circuit field isolation films 64. The cell field isolation films 64r may define the semiconductor active patterns in the cell array region, while the peripheral-circuit field isolation films 64 may define the active regions in the peripheral region. The uppermost interlevel insulation film 60 may be partially etched away to make the cell field isolation film 64r thicker than the uppermost semiconductor layer 62.

Figure 8:
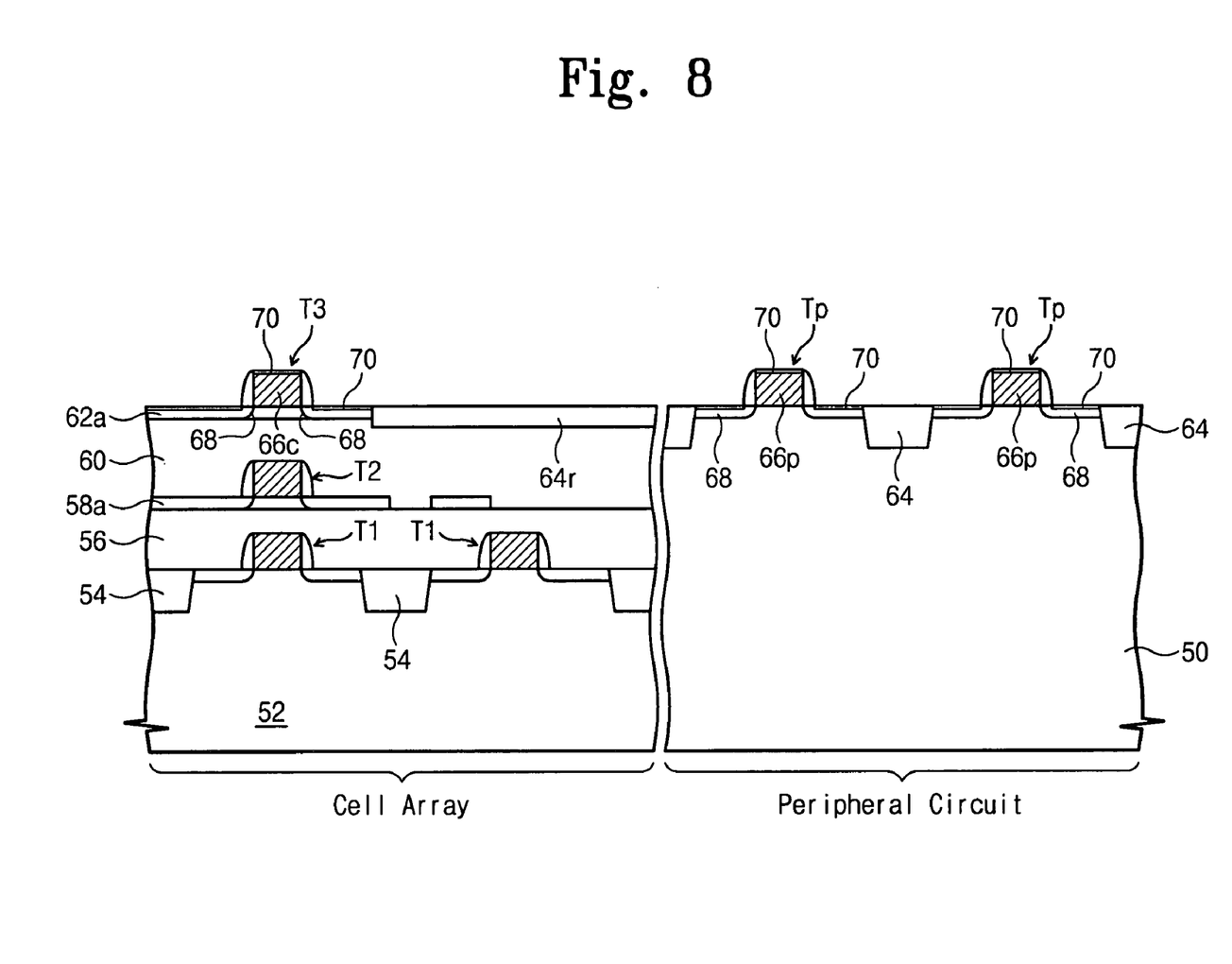

Referring to FIG. 8, on the semiconductor active pattern 62a, the cell transistor T3 may be formed to complete the uppermost cell transistor layer in the cell array region, while the peripheral circuit transistors Tp may be formed in the peripheral region. In order to improve the performance of the integrated circuit, the driving speeds of the peripheral circuit transistors Tp may need to be increased and RC delay rates of the integrated circuit may need to be reduced. Accordingly, the salicide layers 70 may be formed on the source/drain regions 68 and the gate electrodes 66p in the peripheral region. While forming the salicide layers 70, a silicidation protecting layer may be formed in the cell array region, reducing silicidation on the cell transistor T3. When a driving speed of the uppermost cell transistor T3 is to be improved, the salicide layer 70 may be formed on the source/drain regions 68 and the gate electrode 66c in the cell transistor T3.

A typical semiconductor manufacturing process may be carried out to connect the cell transistors, T1, T2, and T3, and the peripheral circuit transistors Tp under the configuration of design rules. As aforementioned, example embodiments may allow peripheral circuit transistors to be fabricated having improved speed and performance because deterioration may be reduced while forming the multi-level transistors in the cell array region. Even with relatively high-performance transistors in the peripheral region, it may be possible to restrain metallic pollutions and increases in resistance, providing a semiconductor device suitable for relatively high-frequency operations.

The above-disclosed subject matter is to be considered illustrative, and not restrictive, and the appended claims are intended to cover all such modifications, enhancements, and other embodiments, which fall within the true spirit and scope of the example embodiments. Thus, to the maximum extent allowed by law, the scope of the example embodiments is to be determined by the broadest permissible interpretation of the claims and their equivalents, and shall not be restricted or limited by the foregoing detailed description.

What is claimed is:

1. A semiconductor device comprising:
   a semiconductor substrate including a peripheral region and a cell array region, wherein the semiconductor substrate in the cell array region is recessed lower than the substrate in the peripheral region, and a surface of the cell array region is an etched surface;
   a plurality of cell transistor layers stacked on the etched surface of the cell array region; and
   a plurality of peripheral circuit transistors formed on the peripheral region of the semiconductor substrate.

2. The semiconductor device as set forth in claim 1, wherein the plurality of peripheral circuit transistors are formed at a same level as an uppermost one of the plurality of cell transistor layers.

3. The semiconductor device as set forth in claim 1, wherein the plurality of peripheral circuit transistors are formed at a different level than an uppermost one of the plurality of cell transistor layers.

4. The semiconductor device as set forth in claim 1, further comprising:
   a global interlevel insulation film covering the plurality of peripheral circuit transistors and an uppermost one of the plurality of cell transistor layers.

5. The semiconductor device as set forth in claim 1, wherein
   source/drain regions of the plurality of peripheral circuit transistors include salicide layers; and
   source/drain regions under an uppermost one of the plurality of cell transistor layers are completed without salicide layers.

6. The semiconductor device as set forth in claim 1, wherein
   source/drain regions of the uppermost one of the plurality of cell transistor layers include salicide layers; and
   source/drain regions of the plurality of peripheral circuit transistors include salicide layers.

7. The semiconductor device as set forth in claim 1, wherein a lowest one of the plurality of cell transistor layers is formed on the substrate of the cell array region.

8. The semiconductor device as set forth in claim 7, further comprising:
   local interlevel insulation films interposed between each of the plurality of cell transistor layers; and
   semiconductor active patterns formed on each of the local interlevel insulation films,
   wherein the plurality of cell transistor layers are formed on the semiconductor active patterns over the lowest of the plurality of cell transistor layers.

9. The semiconductor device as set forth in claim 7, wherein the plurality of cell transistor layers over the lowest of the plurality of cell transistor layers are formed of transistors with full depletion channels.

10. The semiconductor device as set forth in claim 1, further comprising:
    at least one local interlevel insulation film formed in the cell array region;
    a semiconductor active pattern formed on the local interlevel insulation film;
    the lowest of a plurality of cell transistor layers formed on the substrate of the cell array region; and
    at least one cell transistor layer formed on the semiconductor active patterns over the lowest of the plurality of cell transistor layers.

11. The semiconductor device as set forth in claim 10, wherein the plurality of peripheral transistors are formed at the same level as an uppermost one of the plurality of cell transistor layers.

12. The semiconductor device as set forth in claim 10, wherein the plurality of peripheral transistors are formed at a different level than an uppermost one of the plurality of cell transistor layers.

13. The semiconductor device as set forth in claim 1, wherein the plurality of peripheral circuit transistors are formed at a different level than an uppermost one of the plurality of cell transistor layers and at a different level than a lowest one of the plurality of cell transistor layers.

* * * * *